United States Patent
Jeng et al.

[11] Patent Number: 6,097,199
[45] Date of Patent: Aug. 1, 2000

[54] UNIVERSAL DECODER TEST BOARD

[75] Inventors: Edward Jewjing Jeng, Fremont; Son Truong Nguyen, San Jose, both of Calif.

[73] Assignee: LSI Logic Corporation, Milpitas, Calif.

[21] Appl. No.: 09/010,938

[22] Filed: Jan. 22, 1998

[51] Int. Cl.[7] .................................................. G01R 31/02
[52] U.S. Cl. ........................ 324/755; 324/754; 324/758
[58] Field of Search .................................. 324/755, 754, 324/758, 761, 765, 766

[56] References Cited

U.S. PATENT DOCUMENTS

| | | | |
|---|---|---|---|
| 3,654,585 | 4/1972 | Wickersham | 439/65 |
| 4,724,383 | 2/1988 | Hart | 324/754 |
| 5,635,846 | 6/1997 | Beaman et al. | 324/754 |
| 5,639,385 | 6/1997 | McCormick | 216/14 |
| 5,844,418 | 12/1998 | Wood et al. | 324/755 |

*Primary Examiner*—Josie Ballato
*Assistant Examiner*—T. R. Sundaram
*Attorney, Agent, or Firm*—Beyer Weaver Thomas & Nguyen, LLP

[57] ABSTRACT

Provided is a universal decoder test board (UDTB) capable of performing the package interface and pin scrambling functions of a conventional DUT board with a variety of different package designs. The UDTB is designed such that it is capable of interfacing with a variety of different tester interface boards, each tester interface board associated with its own hardware manufacturer tester. The UDTB significantly reduces the time and expense invested in test boards required for testing semiconductor device packages for a variety of different manufacturers' platforms by allowing a given package type to be tested with a plurality of testers on the same UDTB.

19 Claims, 14 Drawing Sheets

UNIVERSAL DECODER TEST BOARD

BACKGROUND OF THE INVENTION

The present invention relates to apparatuses and methods for testing semiconductor devices. More particularly, the invention relates to a universal decoder test board for use in such apparatuses and methods.

New semiconductor device designs are commonly tested in order to ensure that they function properly with the circuitry of the hardware with which they are to be incorporated in a final product. Semiconductor device fabricators typically obtain test circuit boards for each new device design. These boards, referred to as "device under test" (DUT) boards, are designed to interface with testers specific to a particular hardware manufacturer. A conventional DUT board has three essential functions: (1) To provide an appropriate electronic interface with a particular semiconductor device package design; (2) to scramble the package's pins to corresponding channels of a tester apparatus for a particular manufacture's hardware platform; and (3) to provide an appropriate electronic interface to the tester.

FIG. 1A shows various components of a conventional device under test. A semiconductor device package 100 is provided for testing. Conventional device package types include pin grid arrays (PGAs), plastic board grid arrays (PBGAs), plastic quad flat packs (PQFPs), and flip chip plastic board grip arrays (FC-PBGAs). Such packaged designs are well-known to those of skill in the art. In addition to the variety of different package types available for semiconductor devices, the devices may also be manufactured with a variety of different pin counts. Each separate device design and pin count has separate configuration requirements for interfacing with a hardware platform, or its corresponding test board. Therefore, a separate conventional DUT board is required for the testing of each new semiconductor device design.

Semiconductor device package 100 removably interfaces with a conventional DUT board 110 with the assistance of a test socket 102, as indicated by double-headed arrow 101. The socket 102 provides an appropriate electrical coupling in a cavity 103 between the package 100 and the test board 110. The socket 102 is typically bonded through appropriate electrical contacts on a lower surface 104 to an upper surface 112 of the test board 110. The lower surface 114 of the conventional DUT board 110 is designed to interface with a tester (not shown) for a specific manufacturer's hardware platform. Semiconductor device packages 100 of the same type and pin count may be tested on the DUT board 110 by being successively removably (or "interchangeably") engaged within the package engaging cavity 103 of the socket 102.

FIG. 1B shows a top plan view of a conventional DUT test board 110. The test board 110 is typically divided into three regions, each of which provides a particular function. Region 116 is dedicated to coupling with a semiconductor device package to be tested. This region is typically occupied by a test socket, such as described above. Region 118 is dedicated to the circuitry required to scramble the pins of the package being tested to their corresponding tester channels. Region 120 provides the appropriate contacts to the tester for a particular hardware manufacturer's platform. Each hardware platform typically has its own distinct configuration for interfacing with a semiconductor package. It should be noted that the terms "upper", "lower", "top" and "bottom" are used in a relative sense in this application and may be reversed.

While this system provides an effective way to test new semiconductor device package designs, it has the disadvantage that each new package design must have a separate DUT board associated with each tester. Each DUT board is costly and time consuming to develop and construct.

Accordingly, apparatuses and methods which reduce the time and cost associated with the testing of new semiconductor device package designs would be desirable.

SUMMARY OF THE INVENTION

The present invention achieves this result by distributing the three essential functions of a conventional DUT board between two separate test boards: a simplified DUT board capable of providing the appropriate contacts for interface with a particular hardware manufacturer's tester (referred to herein as a tester interface board), and a universal decoder test board (UDTB) capable of performing the package interface and pin scrambling functions of a conventional DUT board with a variety of different package designs. The UDTB is designed such that it is capable of interfacing with a variety of different tester interface boards, each tester interface board associated with its own hardware manufacturer tester. The UDTB significantly reduces the time and expense invested in test boards required for testing semiconductor device packages for a variety of different manufacturers' platforms by allowing a given package type to be tested with a plurality of testers on the same UDTB.

The invention exploits the recognition that each particular pin in any given package has a particular spatial locality that also exists for each pin on any tester. By incorporating a multi-layer circuit board into a UDTB according to a preferred embodiment of the present invention, a particular pin location on the package side of the UDTB may be routed to its appropriate corresponding pin location on the tester interface side of the UDTB.

The present invention provides a semiconductor device test board. The test board includes a first major surface capable of interchangeably interfacing with one or more semiconductor device packages, a second major surface capable of interchangeably interfacing with a plurality of semiconductor device testers, and circuitry connecting the first and second surfaces, in such a way that one or more semiconductor devices may be interchangeably tested with a plurality of testers with the board.

The invention also provides a semiconductor device testing apparatus. The apparatus includes a test board capable of interchangeably interfacing with one or more semiconductor device packages, interchangeably interfacing with a plurality of device testers, and scrambling pins on the packages to pins on the device testers. The apparatus also includes another test board capable of electronically coupling the first test board to a device tester.

The invention further provides a method of testing a semiconductor device with a plurality of hardware platforms. The method involves electronically coupling the semiconductor device with a test board capable of interchangeably interfacing with one or more semiconductor device packages, interchangeably interfacing with a plurality of device testers, and scrambling pins on the packages to pins on the device testers. The method also involves interchangeably electronically coupling the test board to a tester for each hardware platform with which the semiconductor device is to be tested.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1A:
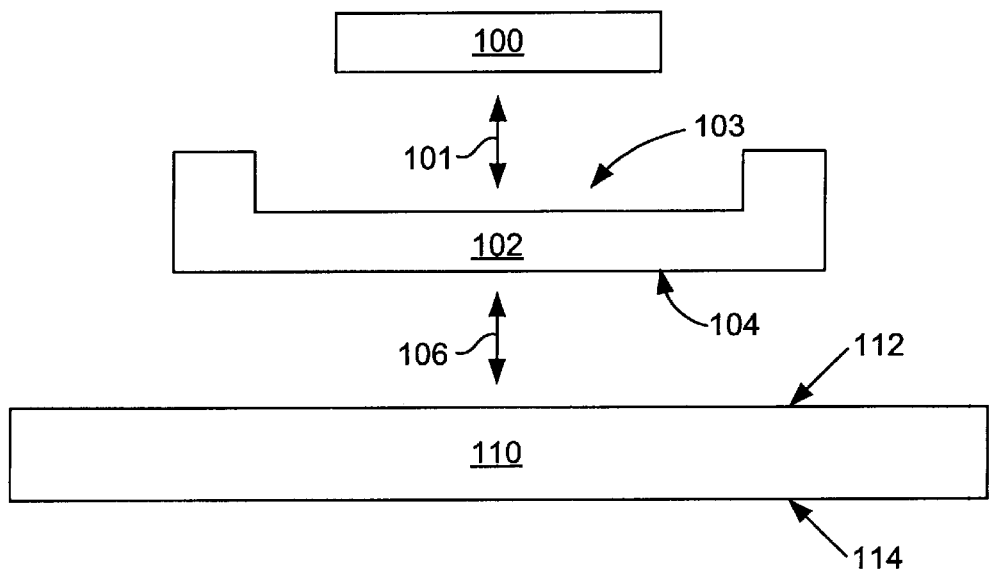
FIG. 1A shows a cross-sectional side view the components a conventional device under test.
Figure 1B:
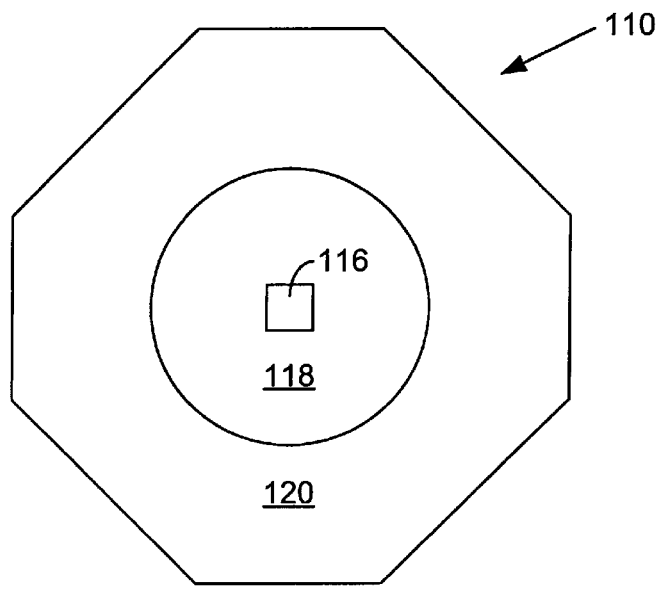
FIG. 1B shows the spatial orientation of functional regions on the top surface of a conventional device under test board.
Figure 2:
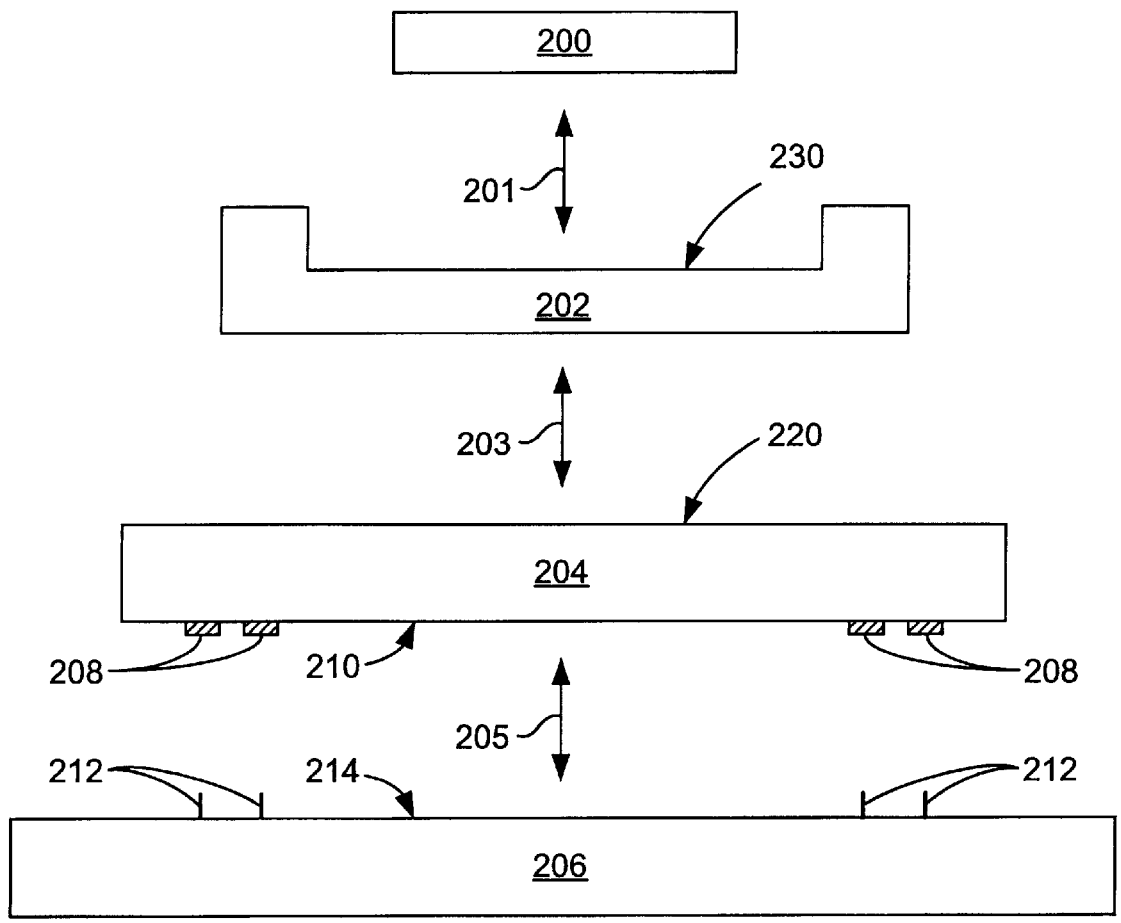
FIG. 2 shows a cross-sectional side view of the components of a device under test according to a preferred embodiment of the present invention.

FIG. 2 shows a universal decoder test board assembly according to the present invention, divided into its constituent components. The figure is a block diagram representing the components in simplified form. A universal decoder test board (UDTB) 204 interfaces with a tester interface board 206 which is specifically designed to interface with a tester for a particular manufacturer's hardware platform (not shown). UDTB 204 interfaces with tester interface board 206 as indicated by double-headed arrow 205 by an electrical coupling of interface components 208 on the bottom surface 210 of UDTB 204 and interface components 212 on the upper surface 214 of test board 206. The interface components 208 and 212 may be any compatible electrical connectors, for example, pads and pins.

The top surface 220 of the UDTB 204 is designed to interface with a semiconductor device to be tested in the assembly. According to a preferred embodiment of the present invention, a semiconductor device 200 to be tested, is electrically coupled to the top surface 220 of the UDTB 204 by a test socket 202. The cavity 230 of the socket may be adapted to interface with a package of a certain type and number of pins. The socket is also preferably designed to releasably engage a semiconductor device package during testing. A package of the appropriate type and pin number 200 for the socket 202 may then be removed from the cavity 230, and replaced by another of like type and pin count for testing, as indicated by double-headed arrow 201. The socket 202 may be electrically interfaced and bonded, either permanently or, preferably, releasably to the top surface 220 of the UDTB 204, as indicated by arrow 203.

The semiconductor device package 200 may be of any type, including those well-known in the art, such as the previously noted PGA, PBCA, PQFP, and FC-PBGA. In addition, the semiconductor device package may have any number of pins. Each different package type will normally have a distinct interface for electrical coupling to a hardware platform for its operation. In addition, within each package type, packages having different numbers of pins will also have different interface requirements. As a result, different sockets are preferably provided for packages of different types and different pin numbers.

For example, a 256 pin PGA package will require a different electrical interface, and therefore a different socket than a 256 pin PQFP package.

Moreover, a 512 pin PGA package will have a different interface than the 256 pin PGA package. Therefore, in accordance with a preferred embodiment of the present invention, each of these different package designs, and any other different package designs, would be provided with a corresponding socket having a cavity specifically designed to properly engage it in a releasable manner. Thus, a plurality of semiconductor packages of the same type and pin number may be interchangeably engaged and tested using a single socket, and each package of a particular type and pin number will have a separate socket.

This package-to-socket relationship is well-known to those of skill in the art. In conventional testing systems however, this one-to-one relationship between packages and sockets is carried over to test boards, as well. Therefore, according to the conventional technology, a separate DUT board is required for each packaged design of a different type or pin number. The UDTB of the present invention eliminates the need for a separate test board for each separate package by providing an interface capable of coupling with a package of a given type regardless of the number of pins its has. This is achieved by the recognition that a spatial locality exists for each pin in any package design and that a corresponding spatial locality also exists for each pin in any tester. By use of appropriate circuitry coupling the device interface with the tester interface, a particular location on the device interface side of the UDTB may be routed to a particular and corresponding location on the tester interface side of the UDTB. As a result, any semiconductor package of a given type may be tested on any tester with a single UDTB used in conjunction with a second simplified test board which provides contacts to the appropriate tester (tester interface board).

Figure 3A:
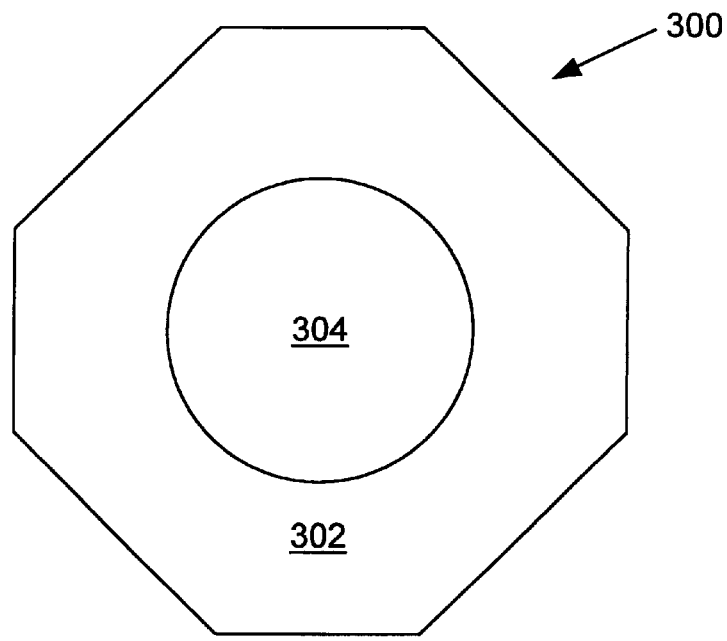
FIG. 3A shows a top view of a tester interface board according to a preferred embodiment of the present invention.

FIG. 3A shows a test board specifically adapted to interface with a tester for a particular manufacturer's hardware platform. In accordance with a preferred embodiment of the present invention, this tester interface board 300 includes a peripheral region 302 having the necessary circuitry and contacts to interface with a tester for a particular manufacturer's hardware platform. A second inner region 304 is provided for interface with a UDTB.

Figure 3B:
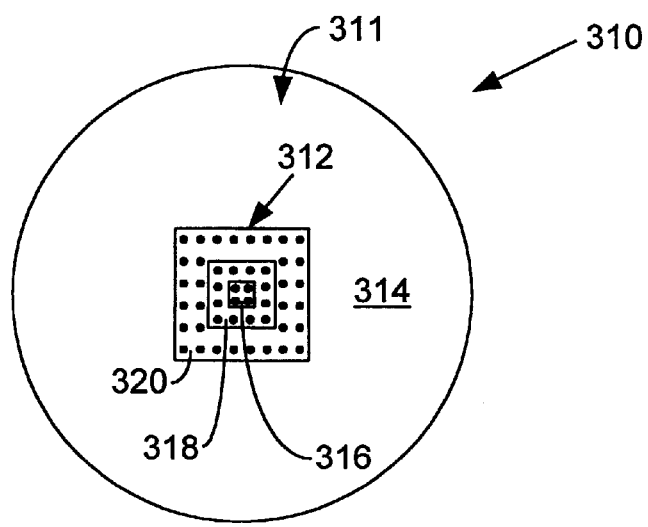
FIG. 3B shows a top view of a universal decoder test board according to a preferred embodiment of the present invention.

FIG. 3B shows a top plan view of a UDTB 310 in accordance with a preferred embodiment of the present invention. The UDTB 3 10 provides the two essential functions of a conventional DUT board beyond the tester interface: An interface for a semiconductor device to be tested, and circuitry for scrambling packaged pins to tester channels.

In a preferred embodiment, the device interface region 312 is surrounded by a pin scrambling region 314. Also in a preferred embodiment, the device interface region 312 is further sub-divided into regions which define an increasing number of pins available for interface with a package to be tested. For example, region 316 may be configured to interface with a package having up to 150 pin counts; region 318 may provide an additional 150 pin counts for a package having up to 300 pin counts; and region 320 may provide a further additional 300 pin counts so that all three regions together provide sufficient pins to interface with a device having a pin count of up to 600.

Thus, a given UDTB may be used to interface with several different packages of the same type having different pin counts.

Figure 3C:
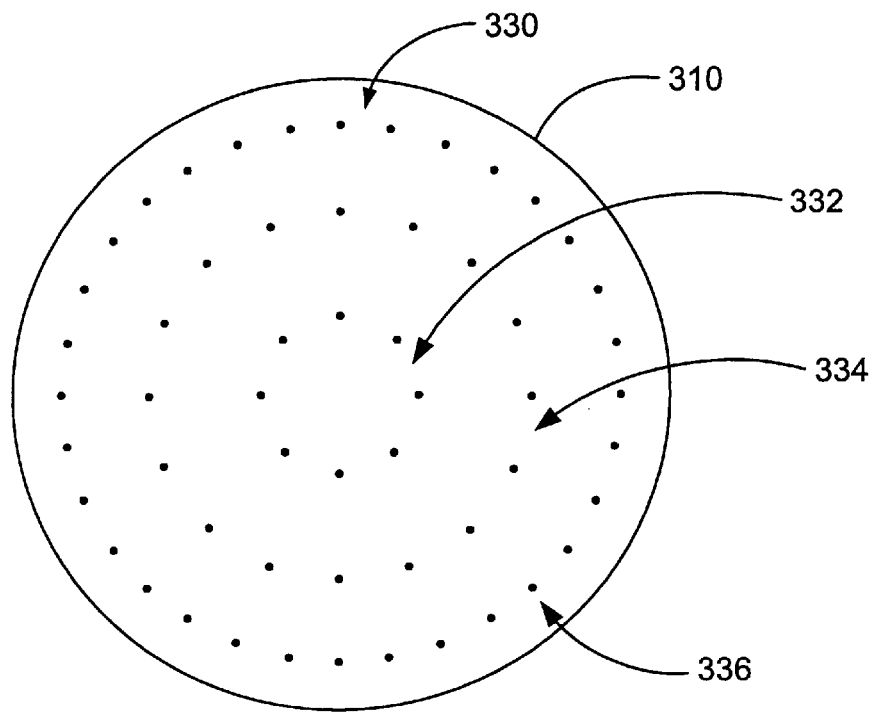
FIG. 3C shows a bottom view of a universal decoder test board according to a preferred embodiment of the present invention.

Referring to FIG. 3C, a contact configuration for interface with test boards for various different test devices is illustrated for the side 330 ("bottom" side) of a UDTB 310 opposite the semiconductor device interface side 311 ("top" side), in accordance with a preferred embodiment of the present invention. UDTB bottom side 330 has a plurality of sets of contacts, each corresponding to an interface configuration of a tester for a particular manufacturer's hardware platform. Testers for different hardware platforms typically vary in size as well as number and distribution of test channels. The bottom of the UDTB 330 may be configured to provide the appropriate number and distribution of contacts to interface with a plurality of different testers (or simplified DUT boards associated with testers, such as described above with reference to FIG. 3A). For example, contact sets corresponding to different tester configurations may be arranged in concentric rings on the bottom of UDTB 330. Ring 332 may provide up to 150 contacts which correspond to test channels for a particular hardware platform and its tester. Rings 334 and 336 may provide 300 and 450 contacts, respectively, for example, for interface with hardware platforms and their testers having such additional test channels. Depending on the tester interfaced with, the UDTB 310 could make use of any one of the contact rings.

Electrical connections are required between the pins on the semiconductor device package interfacing at the top surface, 311 of the UDTB 310 with contacts on the bottom surface 330 of the UDTB 310.

Since the UDTB is intended for use with a number of different packages, perhaps having different pin numbers, and a number of different test devices, typically having different numbers and configurations of test channels, the circuitry connecting the package interface to the tester interface should be capable of providing a electrical connection routing sufficient to accommodate testing of a variety of different package designs with a variety of different testers.

In order to provide the appropriate electrical connections between pins on the semiconductor device package interfacing at the top surface, 311 of the UDTB 310 with contacts on the bottom surface 330 of the UDTB 310, appropriate scrambling circuitry may be used. Methods of designing and implementing circuitry required to match pins to appropriate corresponding contacts on opposite sides of a circuit board is well-known to those of skill in the art.

Figure 3D:
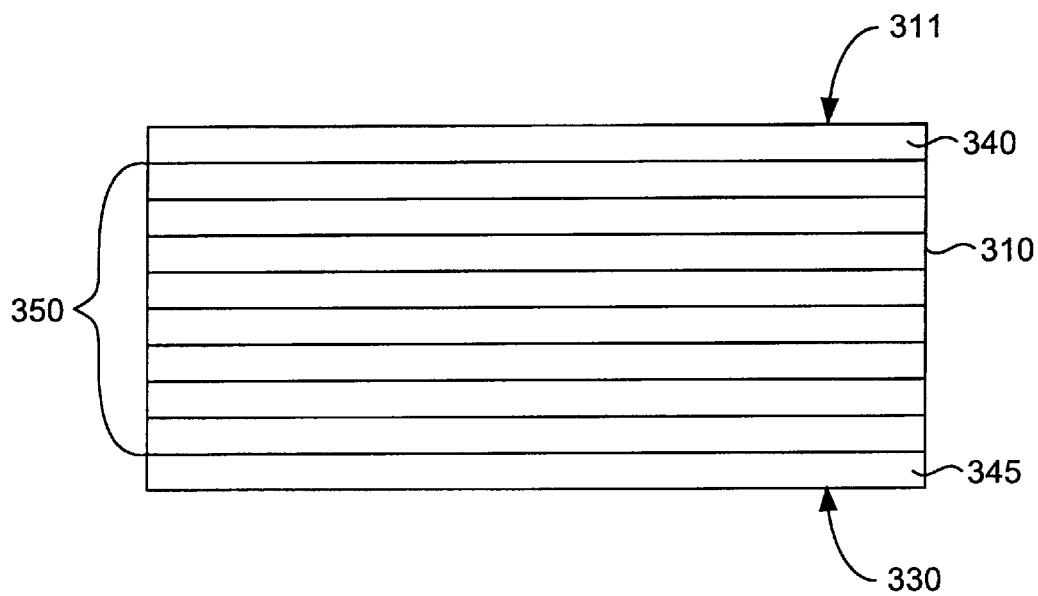
FIG. 3D shows a cross-sectional side view of a universal decoder test board according to a preferred embodiment of the present invention.

FIG. 3D shows a cross-sectional side view of a UDTB 310. In a preferred embodiment of the present invention, the scrambling circuitry is implemented in a multi-layer circuit board. The number of layers in a UDTB may vary depending on the complexity of the circuitry required to scramble package device pins to appropriate corresponding contacts for interfacing with testers. In preferred embodiments, UDTB boards in accordance with the present invention may have from about 3 to twenty layers. The number of layers will generally increase as the number of package designs and/or testers to be compatible with a given UDTB are increased. For example, a UDTB 310 may have eight layers of scrambling circuitry 350 in addition to a package (socket) interface layer 340 and a tester (simplified DUT board) interface later 345.

Figure 4A:
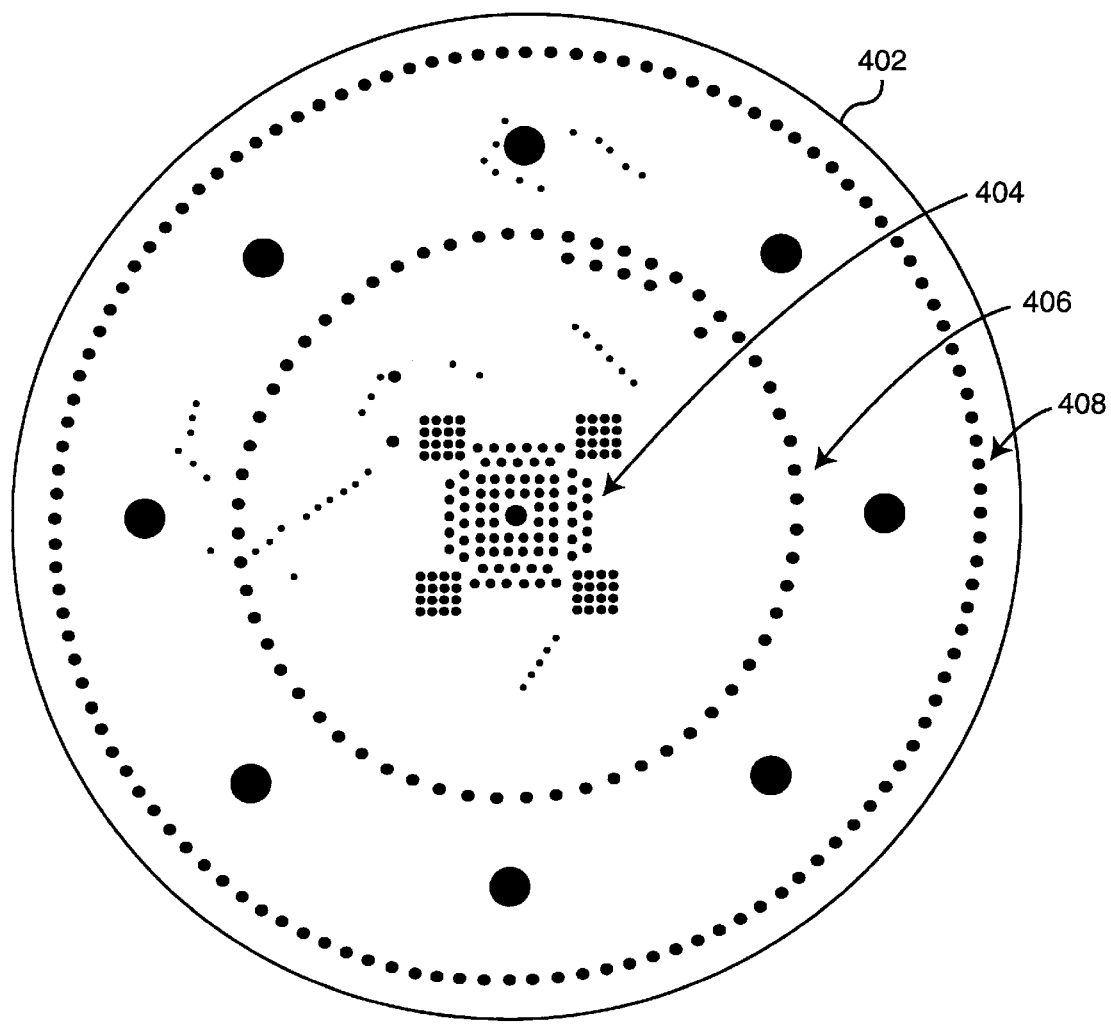
FIGS. 4A through 4J show plan view illustrations of a simplified UDTB design having ten layers.
Figure 4B:
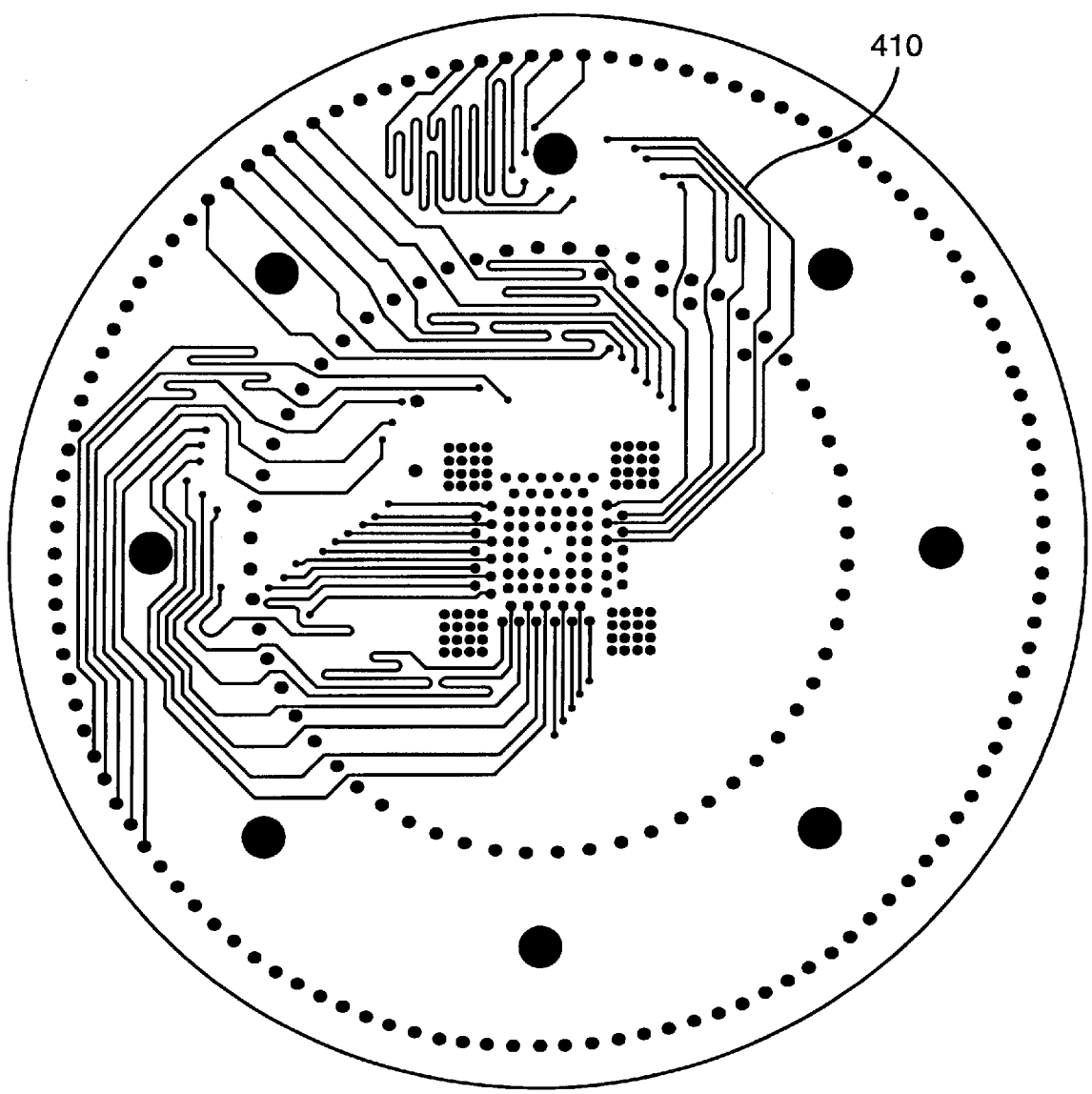
Figure 4C:
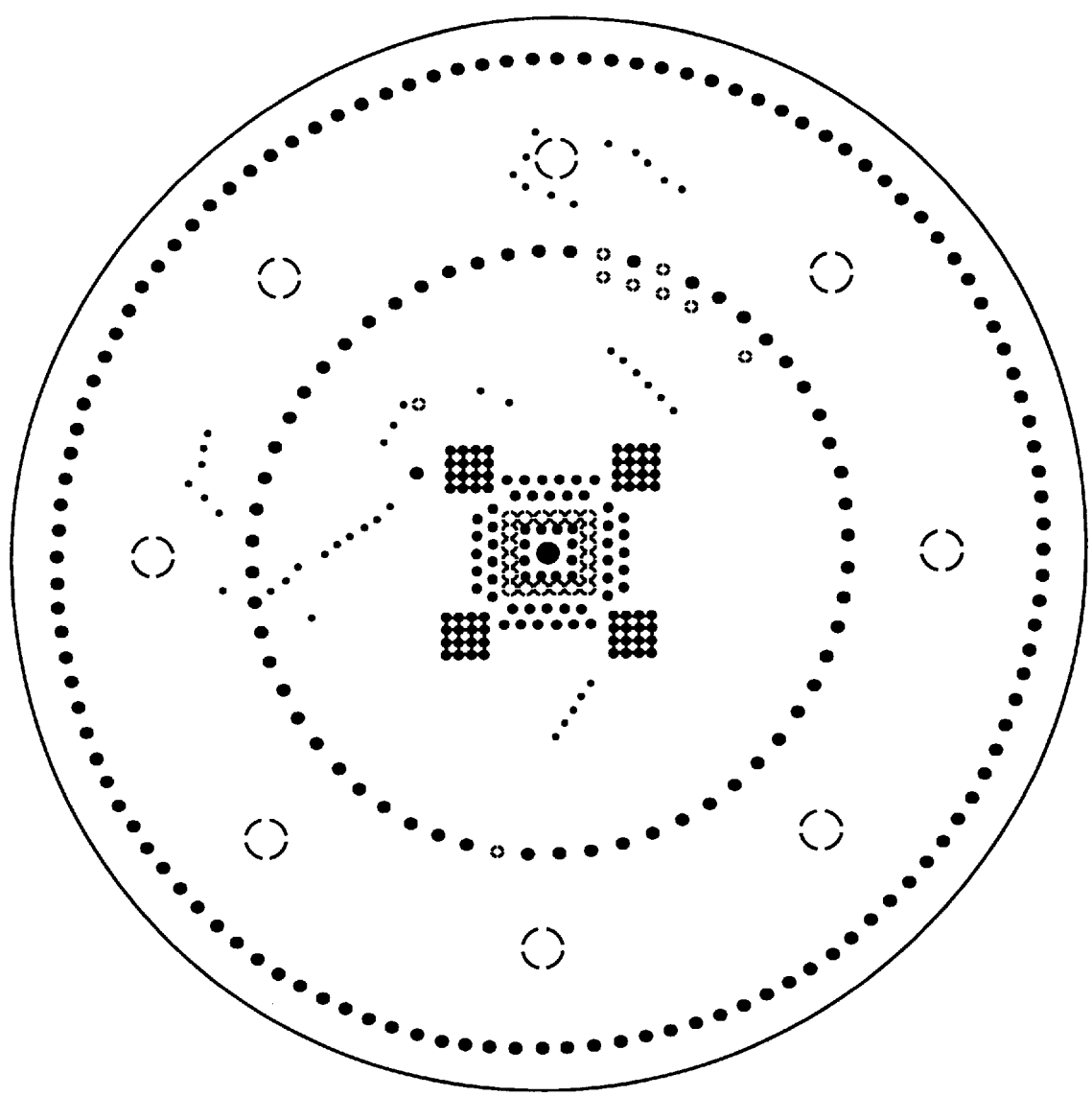
Figure 4D:
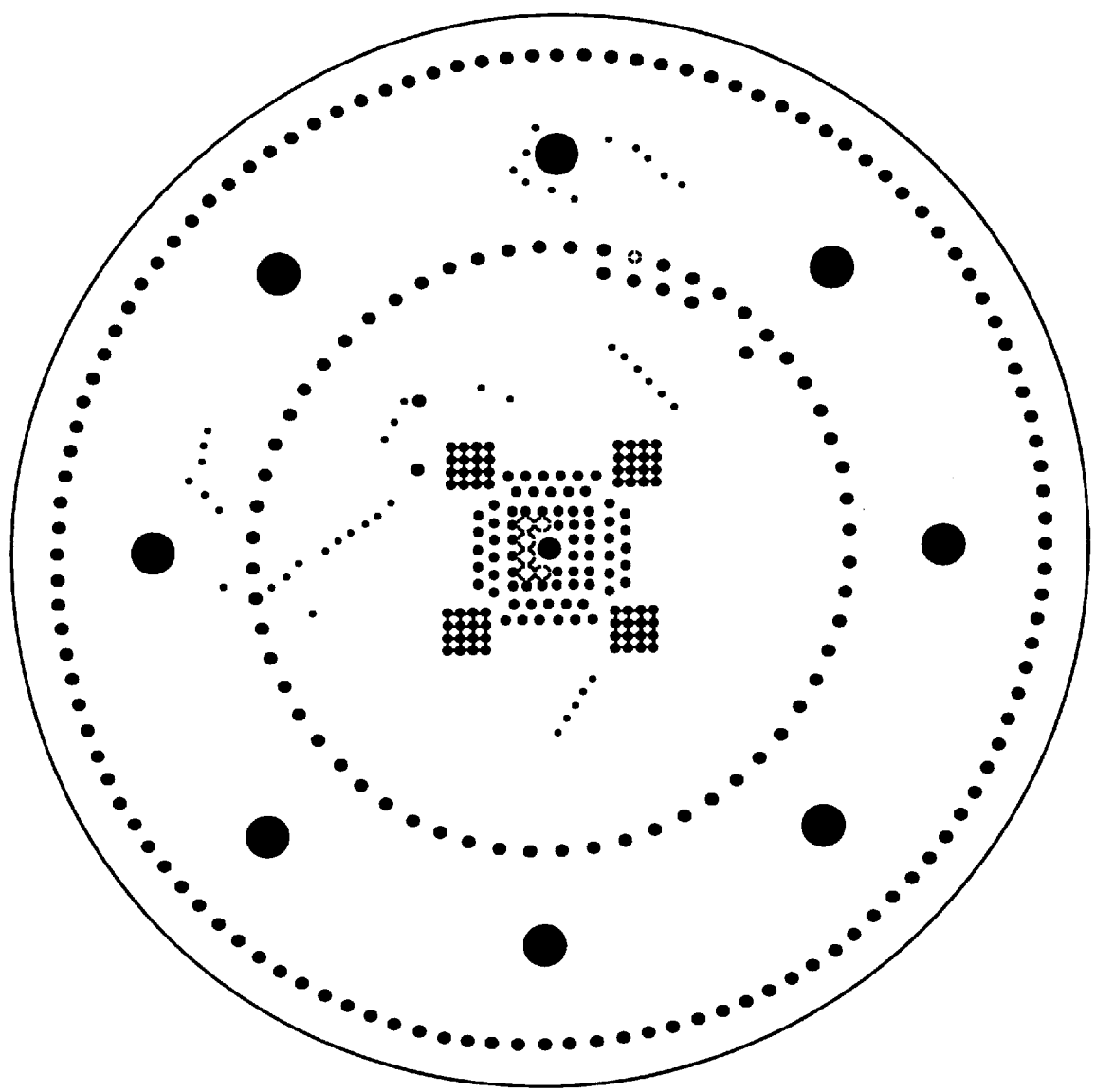
Figure 4E:
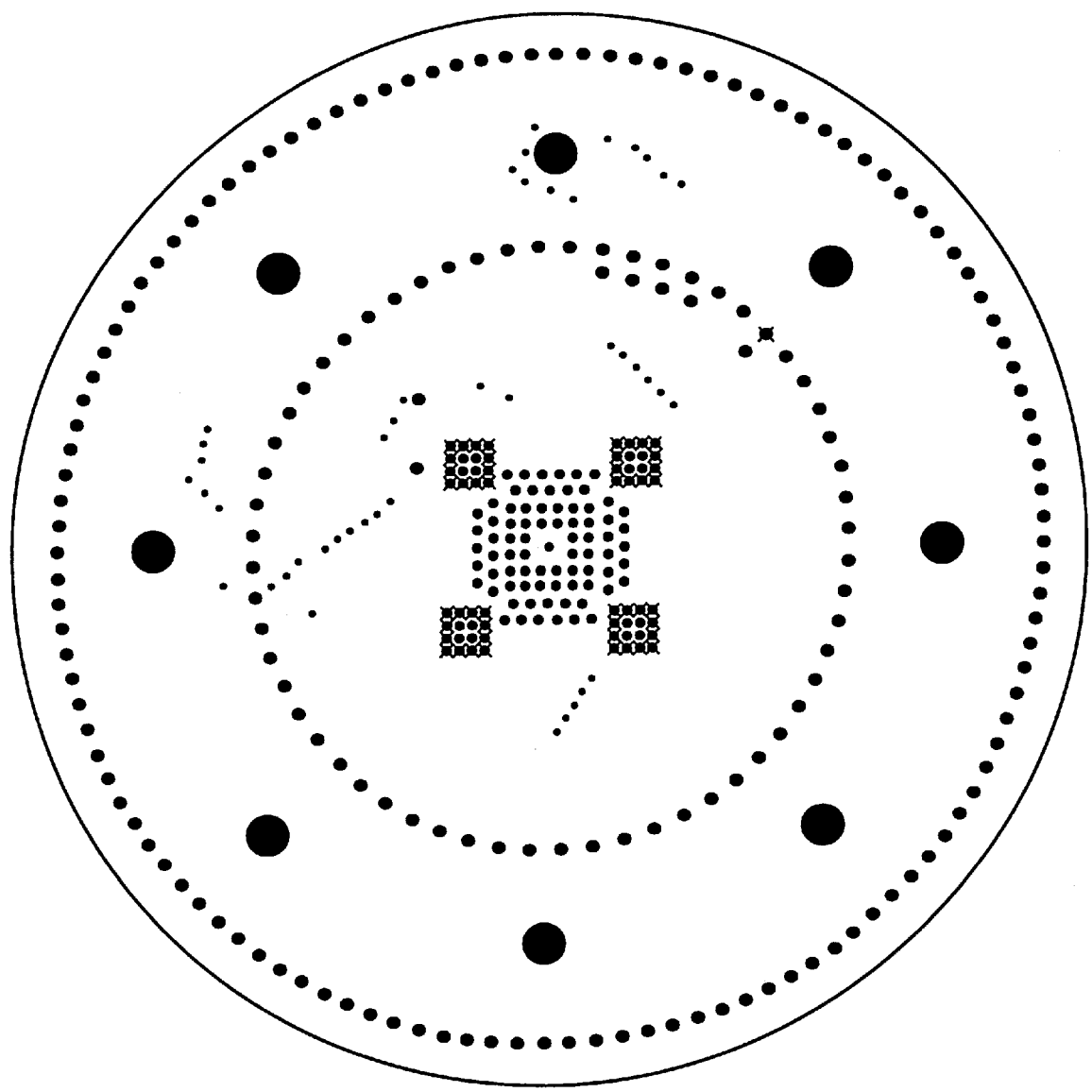
Figure 4F:
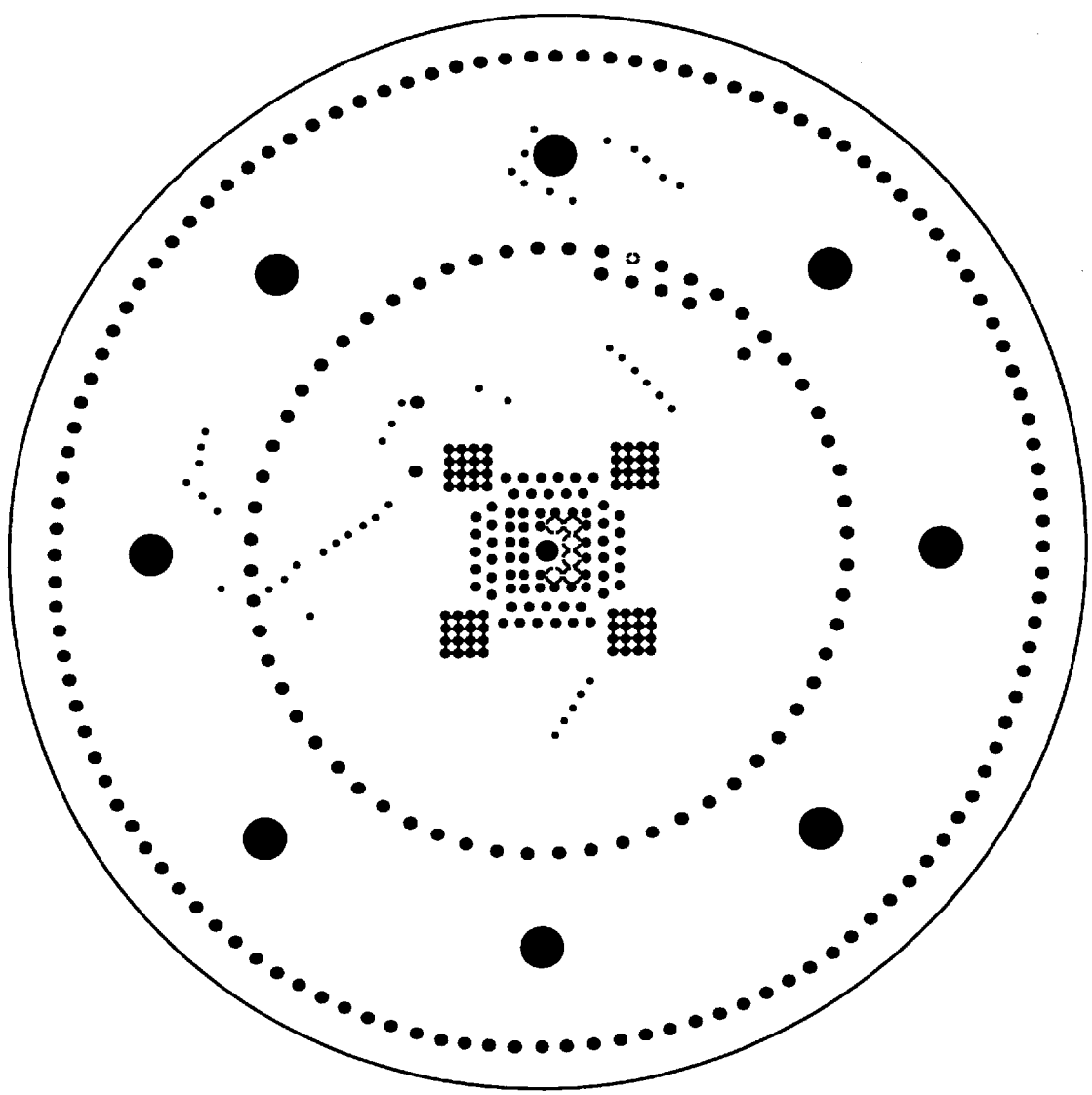
Figure 4G:
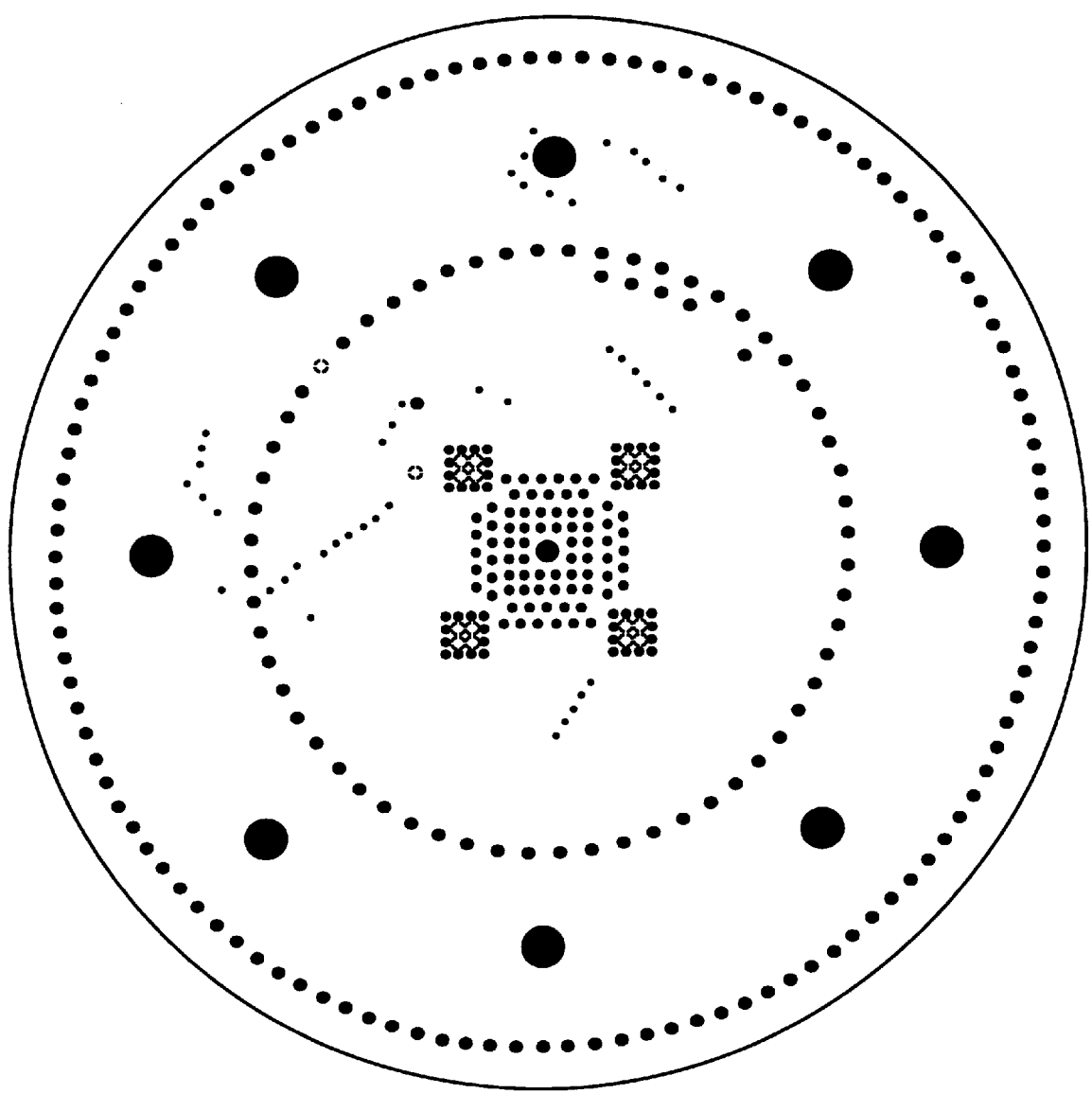
Figure 4H:
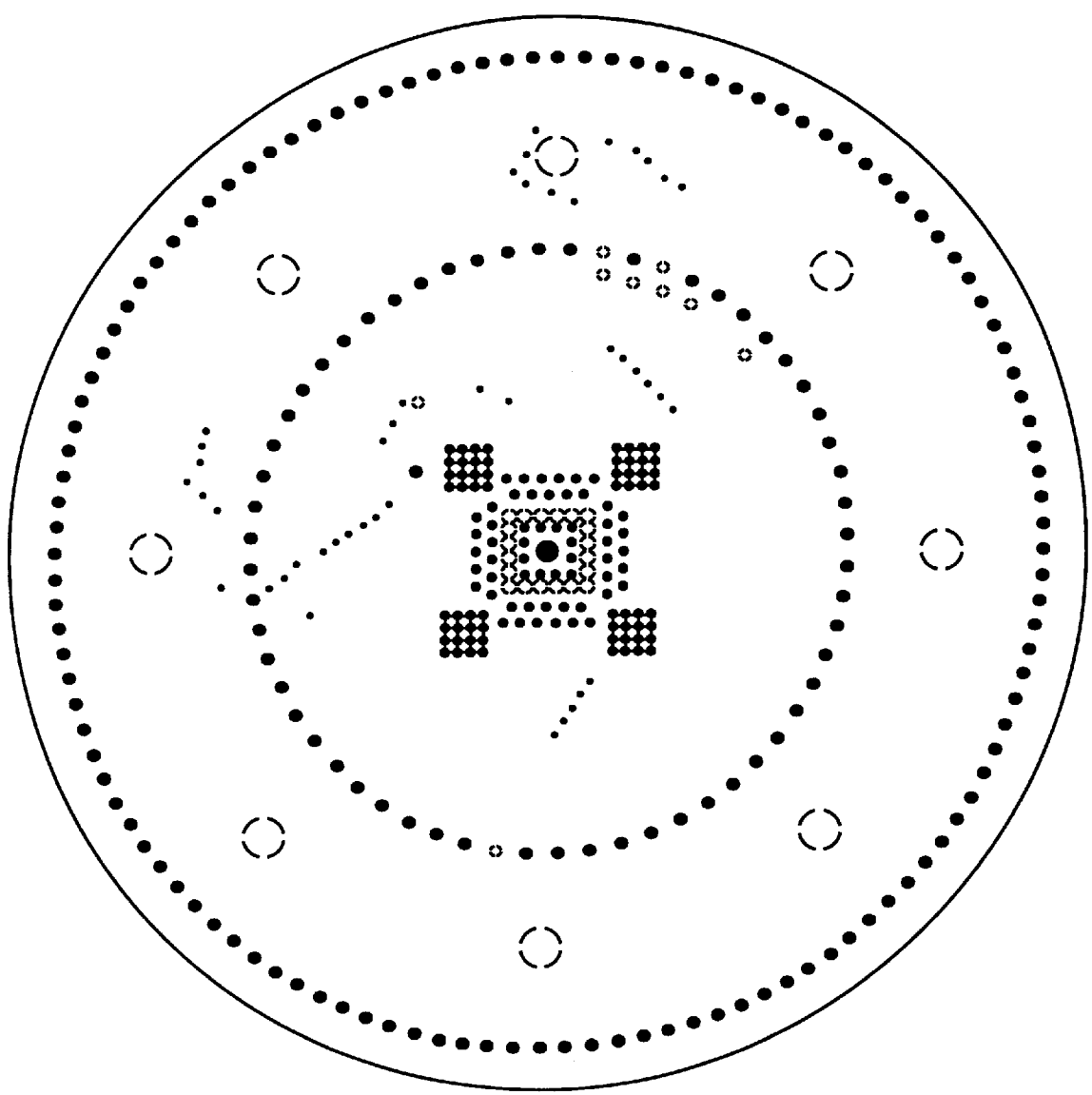
Figure 4I:
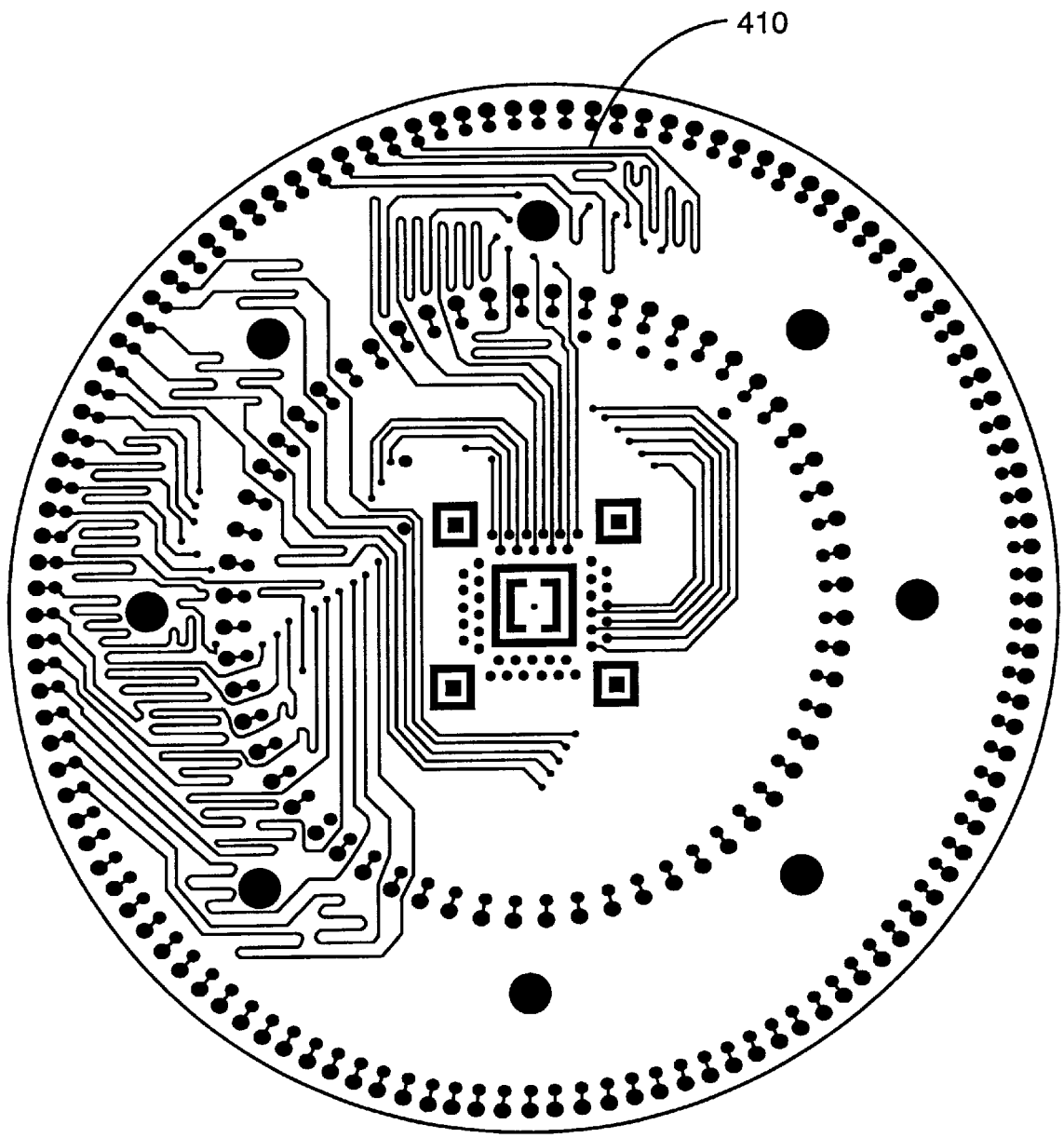
Figure 4J:
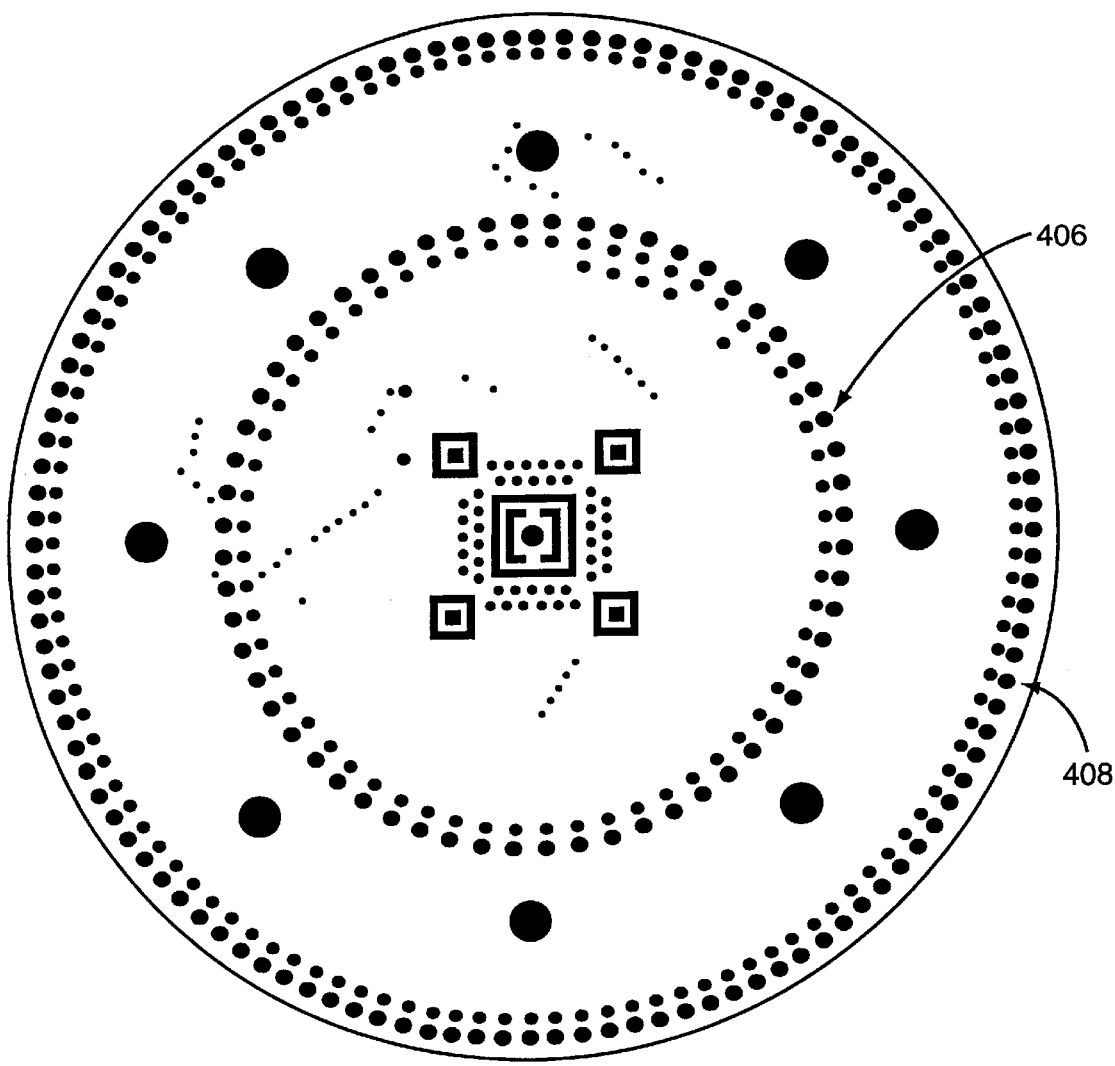

FIGS. 4A through 4J provide illustrations of a simplified UDTB design having eight scramble circuitry layers between the two interface layers. FIG. 4A shows the semiconductor package (or socket) interface surface layer 402 of the UDTB 400. The surface layer 402 includes a socket interface 404 capable of accommodating a plurality of pins, and two concentric rings of contacts 406 and 408 for interfacing with two different simplified tester DUT boards. In this example, the inner ring 406 has 60 contacts, and the outer ring 408 has 120 contacts. In FIGS. 4B and 4I a plurality of electrical traces 410 are shown which provide connections between the pin interface 404 and contacts in the outer contact ring 408. Together with the layers shown in FIGS. 4B–G, these traces provide the appropriate electrical circuitry to scramble pins on the semiconductor device being tested to appropriate channels in the tester which interfaces with outer contact ring 408. Of course, FIGS. 4A–J represent just one implementation of the present invention in a simplified form. Those of ordinary skill in the art will readily recognize that many variations on this design are possible within the scope of the present invention as described above.

As may be seen from the preferred embodiments of the UDTB and device under test according to the present invention described above, the invention relieves the need for a dedicated DUT board for each new semiconductor device package design developed by a semiconductor fabricator. Instead, the fabricator may stock a simplified tester interface board dedicated to a tester for a particular manufacturer's hardware platform together with relatively few UDTBs for the different types of package designs which may be used for package designs of a given type having any number of pins. As described above, these UDTBs may be interchangeably used with a plurality of different packages and a plurality of different testers associated with different hardware platforms. The UDTB significantly reduces the time and expense invested in test boards required for testing semiconductor device packages for a variety of different manufacturers' platforms by allowing a given package type to be tested with a plurality of testers on the same UDTB.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor device test board, comprising:
   a first major surface capable of interchangeably interfacing with one or more semiconductor device packages;
   a second major surface capable of interchangeably interfacing with a plurality of semiconductor device testers; and circuitry connecting said first and second surfaces, such that one or more semiconductor devices packages may be interchangeably tested with a plurality of testers with said board.

2. A test board according to claim 1, further comprising a socket capable of electronically coupling a semiconductor device package to be tested to said first major surface.

3. A test board according to claim 1, wherein said circuitry is capable of scrambling pins on a semiconductor device interfaced with said first major surface to pins on a tester interfaced with said second major surface.

4. A test board according to claim 1, wherein said test board comprises a plurality of layers, said first major surface on a top layer, said second major surface on a bottom layer, and said circuitry distributed between one or more intervening layers.

5. A test board according to claim 4, wherein said test board has from three to twenty layers.

6. A test board according to claim 5, wherein said test board as ten layers.

7. A test board according to claim 1, wherein said first major surface includes a semiconductor device interface functional regions surrounded by a pin scramble functional region.

8. A test board according to clam 1, wherein said circuitry is capable of connecting corresponding pins on said one or more semiconductor device packages and said plurality of tasters according to the spatial locality of said pins on said one or more packages and said testers.

9. A semiconductor device testing apparatus, comprising:
   a first test board capable of interchangeably interfacing with one or more semiconductor device packages, interchangeably interfacing with a plurality of device testers, and scrambling pins on said packages to pins on said device testers; and
   a second test board capable of electronically coupling said first test board to a device tester.

10. An apparatus according to claim 9, wherein said first test board comprises a plurality of layers, said circuitry distributed between said plurality of layers.

11. An apparatus according to claim 10, wherein said first test board has from three to twenty layers.

12. An apparatus according to claim 10, wherein said first test card has ten layers.

13. An apparatus according to claim 9, wherein said circuitry is capable of connecting corresponding pins on said one or more semiconductor device packages and said plurality of testers according to the spatial locality of said pins on said one or more devices and said testers.

14. A method of testing a semiconductor device package with a plurality of hardware platforms, comprising:
   electronically coupling said semiconductor device package with a test board capable of interchangeably interfacing with one or more semiconductor device packages, interchangeably interfacing with a plurality of device tester; and scrambling pins on said packages to pins on said device testers; and
   interchangeably electronically coupling said test board to a tester for each hardware platform with which the semiconductor device is to be tested.

15. A method according to claim 14, wherein said test board comprises a plurality of layers, said circuitry distributed between said plurality of layers.

16. A method according to claim 15, wherein said test board has from three to twenty layers.

17. An apparatus according to claim 15, wherein said test board as ten layers.

18. An apparatus according to claim 14, wherein said circuitry is capable of connecting corresponding pins on said one or more semiconductor device packages and said plurality of testers according to the spatial locality of said pins on said one or more devices and said testers.

19. A semiconductor device test board, comprising:
   means for interchangeably interfacing with one or more semiconductor device packages;
   means for interchangeably interfacing with a plurality of hardware platform testers; and
   means for connecting said package and tester interface means for providing correct electrical connection between said package and said tester, such that one or more semiconductor devices may be interchangeably tested with a plurality of testers.

* * * * *